(12) United States Patent
Mader et al.

(10) Patent No.: US 9,865,461 B2
(45) Date of Patent: Jan. 9, 2018

(54) PROCESS FOR PRODUCING STRUCTURED COATINGS

(71) Applicants: Christoph Mader, Muenster (DE); Paul Henrich Woebkenberg, Hoelingen (DE); Joachim Erz, Schwoerstadt (DE); Stephan Traut, Loerrach Brombach (DE); Matthias Patz, Bottrop (DE); Michael Coelle, Schwanstetten (DE); Stephan Wieber, Karlsruhe (DE); Patrik Stenner, Hanau (DE); Janette Klatt, Recklinghausen (DE); Odo Wunnicke, Muenster (DE)

(72) Inventors: Christoph Mader, Muenster (DE); Paul Henrich Woebkenberg, Hoelingen (DE); Joachim Erz, Schwoerstadt (DE); Stephan Traut, Loerrach Brombach (DE); Matthias Patz, Bottrop (DE); Michael Coelle, Schwanstetten (DE); Stephan Wieber, Karlsruhe (DE); Patrik Stenner, Hanau (DE); Janette Klatt, Recklinghausen (DE); Odo Wunnicke, Muenster (DE)

(73) Assignee: Evonik Degussa GmbH, Essen (DE)

( * ) Notice: Subject to any disclaimer, the term of this patent is extended or adjusted under 35 U.S.C. 154(b) by 0 days.

(21) Appl. No.: 14/899,435

(22) PCT Filed: Jun. 6, 2014

(86) PCT No.: PCT/EP2014/061789
§ 371 (c)(1),
(2) Date: Dec. 17, 2015

(87) PCT Pub. No.: WO2014/202405
PCT Pub. Date: Dec. 24, 2014

(65) Prior Publication Data
US 2016/0155637 A1    Jun. 2, 2016

(30) Foreign Application Priority Data

Jun. 18, 2013   (DE) .................. 10 2013 010 099

(51) Int. Cl.
C23C 18/00     (2006.01)
H01L 21/02     (2006.01)
C23C 18/12     (2006.01)

(52) U.S. Cl.
CPC .... *H01L 21/02628* (2013.01); *C23C 18/1204* (2013.01); *H01L 21/02532* (2013.01)

(58) Field of Classification Search
USPC .......................... 427/58, 98.4, 99.2
See application file for complete search history.

(56) References Cited

U.S. PATENT DOCUMENTS 6,541,354 B1 *  4/2003  Shimoda .................. C30B 7/00
                                                  257/E21.114
8,669,169 B2 *  3/2014  Inns ..................... H01L 21/2225
                                                  257/E21.491

(Continued)

FOREIGN PATENT DOCUMENTS

EP         1 087 428 A1      3/2001
WO    WO 2009/086105 A1      7/2009

OTHER PUBLICATIONS

International Search Report and Written Opinion dated Sep. 23, 2014 in PCT/EP2014/061789 (with English language translation).

*Primary Examiner* — Brian K Talbot
(74) *Attorney, Agent, or Firm* — Oblon, McClelland, Maier & Neustadt, L.L.P.

(57) ABSTRACT

The present invention relates to a liquid-phase process for producing structured silicon- and/or germanium-containing coatings by the application to a substrate of at least one coating composition, the partial activation of the resulting coating on the coated substrate, and oxidation of non-
(Continued)

activated coating on the substrate, to the coats produced by the process and to their use.

12 Claims, 3 Drawing Sheets

(56) References Cited

U.S. PATENT DOCUMENTS

| | | |
|---|---|---|
| 2008/0308143 A1 | 12/2008 | Atanackovic |
| 2009/0242019 A1 | 10/2009 | Ramamoorthy et al. |
| 2010/0197102 A1* | 8/2010 | Akao .................. C23C 18/1212 438/303 |
| 2011/0171098 A1* | 7/2011 | Knies .................... C01B 33/107 423/342 |
| 2012/0012166 A1 | 1/2012 | Atanackovic |
| 2013/0026453 A1* | 1/2013 | Kunze .................... C01B 33/04 257/40 |

* cited by examiner

PROCESS FOR PRODUCING STRUCTURED COATINGS

The present invention relates to a process for producing structured silicon- and/or germanium-containing coatings, to the coats obtainable by the process, and to the use thereof.

A variety of applications require structured conducting, semiconducting or insulating coatings, such as for use in diodes, for emitter regions and base regions in back-contact solar cells or as barriers on steel or glass, for example.

Processes for producing structured coatings are already known in the prior art. Hence there have already been various techniques for producing structured surfaces, based on photolithographic technologies, wet-etching methods and/or laser ablation (P. Engelhart et al., Prog. Photovolt: Res. Appl. 15 (3), 237-243, May 2007); J. Haschke et al., Energy Procedia 27(2012) 116-121; N.-P. Harder, Phys. Stat. Sol. (RRL) 2, No. 4, 148-150 (2008); M. Z. Rahman, Optics and Photonics Journal, 2012, 2, 129-134). Common to all of these methods, however, is a high level of technical complexity, making it difficult as a result to produce fine structures.

For semiconductor applications in particular, however, there is great interest in structured silicon- and/or germanium-containing coatings, especially in very fine coat structures.

Structured silicon- and/or germanium-containing coatings can also be produced via printing processes. For example, WO 2009/086105 A1 discloses a process in which in a targeted manner a selected region of a substrate is coated with a liquid silane, more particularly by printing, and is subsequently converted into a polymerized material. EP 1 087 428 A1 as well discloses a process for producing a silicon film, in which a printing ink comprising a silicon compound is applied in structured form to a substrate via an inkjet procedure. WO 2008/137811 A2 as well discloses a process for producing a substrate coated with a structured material, in which a printing ink comprising precursor is applied via a printing process, in the form of a line, to the substrate, and is converted. With this as well, however, it is not possible to achieve sufficiently fine structures.

Another alternative for producing structured silicon- and/or germanium-containing coatings is disclosed in U.S. Pat. No. 8,124,040 B1. Described therein is a process for producing silicon- or germanium-containing films by applying coating compositions comprising cyclic silicon- and/or germanium-containing precursors to a substrate. Subsequently a structured film is produced by selective irradiation (more particularly by irradiation using a mask), and the film present in the unirradiated regions is washed off using an appropriate solvent. Even via this process, however, it is not possible to produce structures having sufficient fineness. Moreover, the washing step may detract from the electrical properties of the remaining coat. In addition, probably on account of the washing step, the boundaries of the structured coat lack adequate definition, leading to disadvantages in electronic components.

It is the object of the present invention, therefore, to provide a process for producing structured silicon- and/or germanium-containing coatings that avoids the disadvantages of the prior art and allows the production in particular of particularly fine structures with well-defined boundaries.

The present object is achieved by the liquid-phase process of the invention for producing structured silicon- and/or germanium-containing coatings, in which at least one coating composition is applied to a substrate, the resulting coating is partially activated on the substrate, and non-activated coating on the substrate is oxidized.

Figure 1:
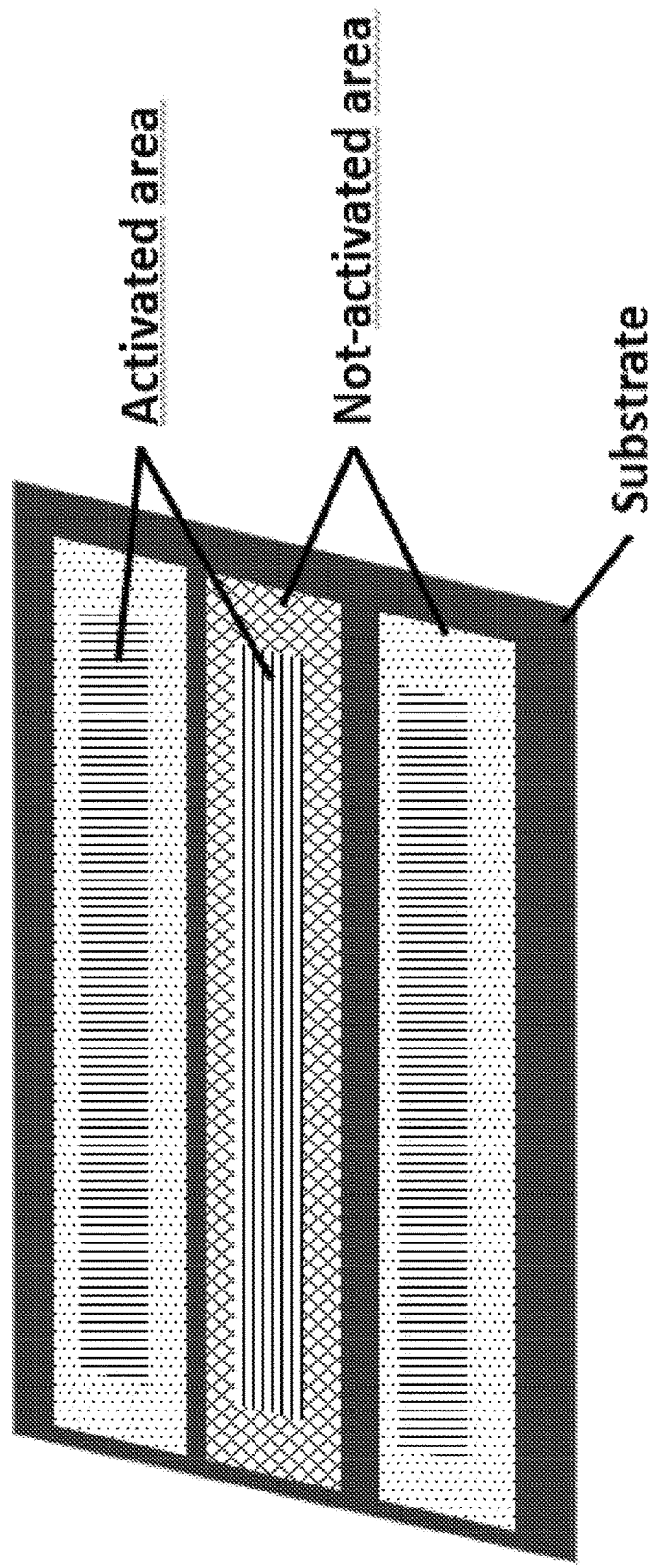
FIG. 1 shows a substrate on which locally 2 different inks (dotted and criss-crossed regions) have been deposited without overlap.

A liquid-phase process is understood presently to be a process in which liquid reactants (possibly acting as solvents for other additives and/or dopants) or liquid solutions comprising the reactants (which are themselves liquid or solid) (and optionally further additives and/or dopants, the latter more particularly in the form of compounds of elements from main groups III. and V.) are applied to the substrate to be coated and are subsequently converted thermally, with electromagnetic radiation and/or by electron beam bombardment or ion bombardment into a substantially elemental, amorphous, monocrystalline and/or polycrystalline silicon- or germanium-containing coating, preferably into an elemental, amorphous, monocrystalline and/or polycrystalline silicon- or germanium-containing coating. "Activation" in the sense of the present invention therefore means "thermal converting and/or converting with electromagnetic radiation and/or by electron beam or ion bombardment".

The structured silicon- and/or germanium-containing coatings producible by the process of the invention may comprise or consist of elemental silicon, elemental germanium or a mixture of elemental silicon and germanium. The structured coatings producible by the process of the invention may therefore consist of pure silicon, pure germanium or of a pure mixture of silicon and germanium. A "pure" coating in this context means a coating whose silicon and/or germanium content is at least 90 mol %, preferably at least 95 mol %, more preferably at least 97 wt %, based on the sum total of all of the (semi-)metals present. The structured coatings produced by the process of the invention may likewise be coatings which as well as silicon and/or germanium also include other elements. The structured coatings producible by the process of the invention are preferably coatings composed of pure silicon, pure germanium or a pure mixture of silicon and germanium.

A "structured" silicon- and/or germanium-containing coating means in the present context a coating which does not cover the substrate completely or substantially completely, but which instead covers the substrate partially, with generation of structuring. Such structuring may take on the achievement of technical objectives, especially within semiconductor technology. Typical examples of structured coats are conductor tracks (e.g. for contacts), finger structures or punctiform structures (e.g. for emitter regions and base regions in the case of back-contact solar cells) and selective emitter structures in the case of solar cells. Also used presently, as an alternative to "structured silicon- and/or germanium-containing coating", is the term "silicon- and/or germanium-containing coat structure".

Coating compositions in the sense of the present invention are compositions which are liquid under SATP conditions (25° C., 1.013 bar), which either consist of or comprise at least one silicon- and/or germanium-containing precursor which is liquid under SATP conditions or which consist of or comprise at least one solvent and at least one silicon- and/or germanium-containing precursor which is solid or liquid under SATP conditions. Particularly good results can be achieved with coating compositions comprising at least one solvent and at least one silicon- and/or germanium-containing precursor which is solid or liquid under SATP conditions, since these compositions are particularly amenable to printing. A precursor here is a liquid or solid, silicon- and/or germanium-containing compound or a variety of silicon- and/or germanium-containing particles, from which a silicon- and/or germanium-containing coating can be produced via at least one mode of conversion selected from thermal conversion, conversion with electromagnetic radiation, electron beam bombardment and ion bombardment. Where the precursor used is a silicon- and/or germanium-containing particle, it is preferably a silicon- and/or germanium-containing nanoparticle. Nanoparticles in this context are small particular solids whose three dimensions lie substantially between 1 and 100 nm. The manner in which such silicon- and/or germanium-containing nanoparticles can be produced is familiar to the skilled person.

The silicon- and/or germanium-containing precursors used in accordance with the invention are preferably compounds containing silicon and/or germanium.

Preferred silicon- and/or germanium-containing precursors are compounds containing silicon or germanium under SATP conditions (more particularly liquid or solid compounds) of the formula $M_nX_c$ with M=Si and/or Ge, X=H, F, Cl, Br, I, $C_1$-$C_{10}$ alkyl, $C_1$-$C_{10}$ alkenyl, $C_5$-$C_{20}$ aryl, n≥4 and 2n≤c≤2n+2. Corresponding compounds are part of the prior art.

Particularly good results are obtainable using a coating composition having at least two precursors, of which at least one is a hydridosilane of the generic formula $Si_nH_{2n+2}$ with n=3 to and at least one is a hydridosilane oligomer. Corresponding formulations are suitable especially for producing high-quality, thin and fine coats from the liquid phase, wet common substrates well in the coating operation, and have well-defined edges after structuring.

This coating composition is a composition which comprises at least one hydridosilane and at least one hydridosilane oligomer or consists of a mixture of the two. The formulation is preferably liquid, since its handling qualities are then particularly good. Such coating compositions have the advantage of being particularly suitable for the deposition of high-grade, silicon-containing coats.

Hydridosilanes of the formula $Si_nH_{2n+2}$ with n=3 to 10 are non-cyclic hydridosilanes. The isomers of these compounds may be linear or branched. Preferred non-cyclic hydridosilanes are trisilane, isotetrasilane, n-pentasilane, 2-silyltetrasilane and neopentasilane, and also octasilane (i.e. n-octasilane, 2-silylheptasilane, 3-silylheptasilane, 4-silylheptasilane, 2,2-disilylhexasilane, 2,3-disilylhexasilane, 2,4-disilylhexasilane, 2,5-disilylhexasilane, 3,4-disilylhexasilane, 2,2,3-trisilylpentasilane, 2,3,4-trisilylpentasilane, 2,3,3-trisilylpentasilane, 2,2,4-trisilylpentasilane, 2,2,3,3-tetrasilyltetrasilane, 3-disilylhexasilane, 2-silyl-3-disilylpentasilane and 3-silyl-3-disilylpentasilane) and nonasilane (i.e. n-nonasilane, 2-silyloctasilane, 3-silyloctasilane, 4-silyloctasilane, 2,2-disilylheptasilane, 2,3-disilylheptasilane, 2,4-disilylheptasilane, 2,5-disilylheptasilane, 2,6-disilylheptasilane, 3,3-disilylheptasilane, 3,4-disilylheptasilane, 3,5-disilylheptasilane, 4,4-disilylheptasilane, 3-disilylheptasilane, 4-disilylheptasilane, 2,2,3-trisilylhexasilane, 2,2,4-trisilylhexasilane, 2,2,5-trisilylhexasilane, 2,3,3-trisilylhexasilane, 2,3,4-trisilylhexasilane, 2,3,5-trisilylhexasilane, 3,3,4-trisilylhexasilane, 3,3,5-trisilylhexasilane, 3-disilyl-2-silylhexasilane, 4-disilyl-2-silylhexasilane, 3-disilyl-3-silylhexasilane, 4-disilyl-3-silylhexasilane, 2,2,3,3-tetrasilylpentasilane, 2,2,3,4-tetrasilylpentasilane, 2,2,4,4-tetrasilylpentasilane, 2,3,3,4-tetrasilylpentasilane, 3-disilyl-2,2-disilylpentasilane, 3-disilyl-2,3-disilylpentasilane, 3-disilyl-2,4-disilylpentasilane and 3,3-disilylpentasilane), the formulations of which lead to particularly good results.

Likewise preferably the hydridosilane of the stated generic formula is a branched hydridosilane, which leads to more stable solutions and better coats than a linear hydridosilane.

Especially preferably the hydridosilane is isotetrasilane, 2-silyltetrasilane, neopentasilane or a mixture of nonasilane isomers that can be produced by way of thermal treatment of neopentasilane or in accordance with a procedure described by Holthausen et al. (Poster presentation: A. Nadj, 6th European Silicon Days, 2012). With formulations of these kinds it is possible to achieve the best outcomes. Even more preferably the hydridosilane is isotetrasilane, 2-silyltetrasilane or neopentasilane.

The hydridosilane oligomer is the oligomer of a hydridosilane compound, and preferably the oligomer of a hydridosilane. The formulation according to the invention is particularly suitable for producing thin coats if the hydridosilane oligomer has a weight-average molecular weight of 200 to 10 000 g/mol. Processes for preparing them are known to the skilled person. Corresponding molecular weights may be determined via gel permeation chromatography using a linear polystyrene column with cyclooctane as eluent, against polybutadiene as reference.

The hydridosilane oligomer is obtained preferably by oligomerization of non-cyclic hydridosilanes. In contrast to hydridosilane oligomers formed from cyclic hydridosilanes, these oligomers have a high crosslinking fraction by virtue of the different, dissociative polymerization mechanism. Oligomers formed from cyclic hydridosilanes have only a very low crosslinking fraction, if any at all, because of the ring-opening reaction mechanism to which cyclic hydridosilanes are subject. In contrast to oligomers formed from cyclic hydridosilanes, corresponding oligomers prepared from non-cyclic hydridosilanes wet the substrate surface well in solution, can be used to particularly good effect for producing thin coats, and result in homogeneous and smooth surfaces. Even better results are displayed by oligomers formed from non-cyclic, branched hydridosilanes.

One particularly preferred hydridosilane oligomer is an oligomer obtainable by thermal reaction of a composition comprising at least one non-cyclic hydridosilane having not more than 20 silicon atoms in the absence of a catalyst at temperatures of <235° C. Such hydridosilane oligomers and their preparation are described in WO 2011/104147 A1, hereby referenced in respect of the compounds and their preparation. This oligomer has even better properties than the other hydridosilane oligomers formed from non-cyclic, branched hydridosilanes.

Besides hydrogen and silicon, the hydridosilane oligomer may also have other radicals. Accordingly, advantages for the coats produced with the formulations may result if the oligomer is carbon-containing. Corresponding carbon-containing hydridosilane oligomers can be prepared by co-oligomerization of hydridosilanes with hydrocarbons. Preferably, however, the hydridosilane oligomer is an exclusively hydrogen- and silicon-containing compound, which thus has no halogen or alkyl radicals.

Preferred for the production of doped, silicon-containing coatings, moreover, are hydridosilane oligomers which have been doped. The hydridosilane oligomers are preferably boron- or phosphorus-doped, and corresponding formulations are suitable for producing p- and n-doped silicon coats, respectively. Corresponding hydridosilane oligomers may be produced by addition of the corresponding dopants during their actual preparation. Alternatively, ready-prepared, undoped hydridosilane oligomers may also be p-doped with substances selected from the group of the p-dopants, preferably the hydroborination reagents (more particularly $B_2H_6$, $BH_3*THF$, $BEt_3$, $BMe_3$), or n-doped with n-dopants (more particularly $PH_3$, $P_4$) by means of an energetic procedure (e.g. UV irradiation or thermal treatment).

The fraction of the hydridosilane or hydridosilanes is preferably 0.1 to 99 wt %, more preferably 1 to 50 wt %, very preferably 1 to 30 wt %, based on the overall mass of the coating composition.

The fraction of the hydridosilane oligomer or oligomers is preferably 0.1 to 99 wt %, more preferably 1 to 50 wt %, very preferably 1 to 20 wt %, based on the overall mass of the coating composition.

The fraction of the hydridosilane oligomer in the coating composition, for the purpose of achieving particularly good results, is also preferably 40-99.9 wt %, more preferably 60-99, very preferably 70-90 wt %, based on the overall mass of hydridosilane and hydridosilane oligomer present.

The coating composition used in the process of the invention need not include solvent. Preferably, however, it comprises at least one solvent. If it does comprise a solvent, the fraction thereof is preferably 0.1 to 99 wt %, more preferably 25 to 95 wt %, very preferably 60 to 95 wt % based on the overall mass of the formulation.

Especially preferred is a coating composition comprising 1-30 wt % hydridosilane, 1-20 wt % hydridosilane oligomer and 60-95 wt % solvent, based on the overall mass of the formulation.

Solvents which can be employed with preference for the coating compositions are those selected from the group consisting of linear, branched or cyclic saturated, unsaturated or aromatic hydrocarbons having 1 to 12 carbon atoms (and optionally partly or fully halogenated), alcohols, ethers, carboxylic acids, esters, nitriles, amines, amides, sulphoxides and water. Particularly preferred are n-pentane, n-hexane, n-heptane, n-octane, n-decane, dodecane, cyclohexane, cyclooctane, cyclodecane, dicyclopentane, benzene, toluene, m-xylene, p-xylene, mesitylene, indane, indene, tetrahydronaphthalene, decahydronaphthalene, diethyl ether, dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, p-dioxane, acetonitrile, dimethylformamide, dimethyl sulphoxide, dichloromethane and chloroform.

Besides the at least one hydridosilane and the at least one hydridosilane oligomer and the solvent or solvents that may be present, the formulation according to the invention may further comprise additional substances, more particularly dopants (preferably $B_2H_6$, $BH_3*THF$, $BEt_3$, $BMe_3$, $PH_3$, $P_4$), nanoparticles or additives for adjusting the rheological properties. Such substances are known to the skilled person.

There are a multiplicity of substrates that may be used for the process of the invention. Preferred substrates are those consisting of glass, vitreous silica, graphite, metal or silicon or consisting of a coat of silicon, of indium tin oxide, of ZnO:F, of ZnO:Al or of $SnO_2$:F on a heat-compatible support. Preferred metals are aluminium, stainless steel, Cr steel, titanium, chromium and molybdenum. If suitable converting conditions are selected, it is also possible, furthermore, to use polymeric films (e.g. of PEEK, PEN, PET or polyimides).

The formulation is applied preferably by a liquid-phase process selected from printing processes (more particularly flexographic/gravure printing, nanoimprint or microimprint, inkjet printing, offset printing, reverse offset printing, digital offset printing and screen printing), spraying methods, aerosol assisted chemical vapour deposition, direct liquid injection chemical vapour deposition, rotational coating methods ("spin coating"), immersion methods ("dip coating") and methods selected from meniscus coating, slit coating, slot-die coating and curtain coating. Of the processes specified above, the gas-phase processes include aerosol assisted chemical vapour deposition and direct liquid injection chemical vapour deposition.

The application of the at least one coating composition may in principle take place areally (i.e. unstructuredly) or in structured form. Particularly fine structures can be obtained with the process of the invention if the actual application of the coating composition to the substrate takes place already in a structured form. A corresponding structured application may be realized, for example, through the use of printing processes. Another possibility is that of structuring via surface pretreatment of the substrate, more particularly via a modification of the surface tension between the substrate and the precursor-containing coating composition by means of a local plasma treatment or corona treatment and hence of a local removal of chemical bonds at the substrate surface or a local activation of the surface (e.g. Si—H termination), by chemical etching operations or by application of chemical compounds (more particularly by means of self-assembled monolayers). Accordingly, structuring is achieved more particularly by the precursor-containing coating composition adhering only to the pre-defined regions with favourable surface tension and/or by the dried or converted coat adhering only at pre-defined regions with favourable surface tension. With preference, however, the process of the invention can be carried out using printing processes.

The process of the invention is more preferably carried out in such a way that at least two different coating compositions are applied in structured form, simultaneously or in succession and also with or without overlap, to different regions of a substrate, the resulting coatings are partially activated, and non-activated coating areas on the substrate are oxidized. By this means it is possible to produce particularly fine structures having various properties. Preferably, moreover, at least one of the coating compositions is a composition suitable for producing intrinsic silicon coats (i.e. containing at least one silicon precursor and no dopants) and at least one other of the coating compositions is a composition suitable for producing (p- or n-)doped silicon coats (i.e. containing silicon precursors and at least one p- or n-dopant, preferably at least one corresponding boron- or phosphorus-containing compound). With a process of this kind it is possible to produce particularly good and simply structured coats for electronic components having specific requirements. A further advantage of this process is that such a process requires only one activating step and one oxidizing step. The liquid-phase process is therefore preferably carried out such that in the sequence of steps 1 to 3

1. at least two different coating compositions are applied to a substrate, 2. the coating resulting after the application of all of the coating compositions is partially activated on the coated substrate, and 3. non-activated coating on the coated substrate is oxidized.

Preferably, moreover, at least one of the coating compositions is a composition suitable for producing intrinsic silicon coats (i.e. containing at least one silicon precursor and no dopants) and at least one other of the coating compositions is a composition suitable for producing (p- or n-)doped silicon coats (i.e. containing silicon precursors and at least one p- or n-dopant, preferably at least one corresponding boron- or phosphorus-containing compound). Here as well the two coating compositions may be applied with or without overlap.

Preferably, following application of the formulation, preliminary crosslinking may be carried out via UV irradiation of the liquid film on the substrate, after which the still-liquid film has crosslinked precursor fractions.

Following application and possibly preliminary crosslinking of the formulation, the coated substrate may with further preference be dried prior to activation or converting, in order to remove any solvent present. Corresponding measures and conditions for this are known to the skilled person. In order to remove only those constituents of the formulation that are volatile, the heating temperature in the case of a thermal drying ought to amount to less than 200° C.

Following the application to the substrate and any subsequent preliminary crosslinking and/or drying, the coating composition present on the substrate is partially activated. In the case of areal, i.e. unstructured application of the coating composition, accordingly, structuring of the resultant coating takes place for the first time. In the event that the actual application of the coating composition took place in a structured form, the partial activation of the structured coating can be used to generate a particularly finely structured silicon- and/or germanium-containing coating.

This partial activation may take place for example through use of a mask or through use of contact dies.

Activation of the process of the invention may in principle take place in various ways. Preference is given to performing the activation or converting thermally, using electromagnetic radiation and/or by electron or ion bombardment.

Thermal activation is carried out preferably at temperatures of 200-1000° C., more preferably 250-750° C., especially preferably 300-700° C. Thermal activation times amount preferably to between 0.1 ms and 360 min. The activation time is more preferably between 0.1 ms and 10 min, very preferably between 1 s and 120 s.

Corresponding rapid energetic procedures may take place, for example, through the use of an IR emitter, a hotplate, a heating die, an oven, a flash lamp, a plasma (more particularly a hydrogen plasma) or a corona with suitable gas composition, an RTP installation, a microwave installation or an electron beam treatment (if necessary in the preheated or warmed-up condition in each case).

Alternatively or in addition, activation may take place by exposure to electromagnetic radiation, more particularly to UV light. The activation time in this case may amount preferably to between 1 s and 360 min. Structuring or partial activation may be realized in this case by means, for example, of use of punctiform or more linear radiation sources or through the use of masks. Particular preference is given to carrying out the activation by exposure to laser radiation. The use of punctiform or linear radiation sources, more particularly of lasers, is advantageous, since it allows particularly fine structures to be achieved. Moreover, when monochromatic radiation is used, via controlled adjustment of the wavelength needed for the activation, the parasitic absorption is reduced and hence the unwanted warming of substrate and/or environment is prevented. The use of electromagnetic radiation for the activation is therefore preferred for this reason.

Likewise possible is activation with ion bombardment. The ions in this case may be generated in a variety of ways. Frequently employed are impact ionization, more particularly electronic impact ionization (EI) or chemical ionization (CI), photoionization (PI), field ionization (FI), fast atom bombardment (FAB), matrix-assisted laser desorption/ionization (MALDI) and electrospray ionization (ESI). In the case of ion bombardment, structuring may likewise be achieved using masks.

The partial activation therefore leads to regions on the substrate where the coating composition present thereon has been converted, and regions in which the coating composition present thereon has not been converted.

Activation in the present context means transformation of the deposited precursors of the resultant coating film into amorphous or crystalline semiconductor coats. When exclusively silicon-containing precursors are used, the activation is preferably conducted in such a way that converting results in structured amorphous or crystalline, more particularly polycrystalline or monocrystalline, silicon coats. Means and ways thereto are known to the skilled person.

If drying was not carried out prior to converting, the unconverted regions may also be dried after the partial converting. Drying here as well takes place at temperatures below 200° C., preferably in a range from 100 to 200° C. Even in the regions with an unconverted coating, drying may be used to produce defined states, with which the optical and electrical properties of the coating may be controlled after the oxidizing step that now follows.

Following the partial converting, unconverted coating on the substrate is oxidized. Consequently, in the regions with unconverted coating, coat structures containing silicon oxide and/or germanium oxide are produced. The converted, silicon- and/or germanium-containing regions already present as a result of the prior conversion are in this case not oxidized, and so the process of the invention can be used to obtain silicon- and/or germanium-containing coat structures which directly border silicon oxide- and/or germanium oxide-containing coat structures. The two coat structures differ in their electronic properties, thereby allowing structured coats to be produced in a simpler way than in the prior art. Accordingly, with the process of the invention, given choice of suitable coating compositions, it is possible, for example, to produce semiconducting silicon- and/or germanium coats which are adjacent to silicon oxide or germanium oxide coats which are able to serve as passivating or insulating coats. One great advantage of the oxidation of the unconverted regions (relative to their removal) is that in the case of the misfunction of printing nozzles, for example, it is possible to avoid short circuits. Moreover, silicon oxide- and/or germanium oxide-containing coat structures represent better passivating coats than other alternatives known in the prior art. Moreover, there is no need for a separate application step for these passivating coats, since the precursor thereof has already been applied to the substrate with the coating composition for producing the silicon- and/or germanium-containing coat.

The skilled person is aware of how the oxidizing conditions must be selected so that unconverted coating regions can be oxidized without likewise oxidizing regions that have already been converted.

The oxidation takes place preferably in an oxygen-containing atmosphere at a temperature≤300° C., more preferably at a temperature≤150° C., very preferably at a temperature≤100° C. Oxidation takes place especially preferably in an oxygen-containing atmosphere at room temperature. The oxygen-containing atmosphere preferably has an oxygen concentration of 1-100 mol % and may include nitrogen or argon, for example, as further gaseous constituents.

Particularly preferred, moreover, is oxidation with oxidizing agents selected from the group consisting of ozone, carbon dioxide, hydrogen peroxide ($H_2O_2$), steam ($H_2O$), a mono- or polyhydric alcohol, a ketone, a carboxylic acid (more particularly trichloroacetic acid), a carbonic ester and mixtures comprising trichloroacetic acid and oxygen, and also HCl and oxygen. Means and ways to the oxidation with these oxidizing agents are known to the skilled person. Particularly preferred is the use of ozone, carbon dioxide, hydrogen peroxide ($H_2O_2$), steam ($H_2O$), a carboxylic acid (more particularly trichloroacetic acid), a carbonic ester and a mixture comprising trichloroacetic acid and oxygen.

The process described for the production of structured silicon- and/or germanium-containing coats may further be carried out multiply in relation to a substrate, simultaneously or in temporal succession (simultaneous or successive deposition, with the resulting films lying partly or completely over one another or being located on different sides of the substrate. The activation of different coatings may therefore take place simultaneously or in succession.). A process of this kind for producing structured multi-coat systems is suitable with preference for producing systems composed of intrinsic (i.e. undoped) and doped coats, which are essential, for example, to the construction of solar cells.

During or subsequent to the converting, more particularly after the oxidation, it is also possible with preference for the silicon-containing coats to be enriched with hydrogen. This is what is called "hydrogen passivation", which compensates defects in the material, and can be carried out, for example, with reactive hydrogen by the hotwire method, with a hydrogen-containing plasma (remote or directly; under reduced or under atmospheric pressure) or by means of corona treatment or an electron beam treatment with supply of hydrogen. Furthermore, the aforementioned drying and/or the converting step may also be carried out in a hydrogen-enriched atmosphere, causing the material to be hydrogen-rich from the outset.

The present invention also provides, furthermore, the structured silicon- and/or germanium-containing coatings produced by the process of the invention.

Likewise provided by the present invention is the use of structured coatings for producing electronic or optoelectronic components. More particularly the coat structures producible in accordance with the invention are suitable (especially as base regions and emitter regions) for use in back-contact solar cells.

The examples below illustrate the subject matter of the present invention without themselves having any limiting effect.

EXAMPLES

Example 1

FIG. 1 shows a substrate on which locally 2 different inks (dotted and criss-crossed regions) have been deposited without overlap. These inks have been transformed locally into amorphous silicon of type 1 (horizontal stripes) and of type 2 (vertical stripes). The transformation or converting has taken place linearly. The converted region is labelled "activated". The unconverted region is labelled as "not-activated". In this region there is a silicon oxide.

Example 2

Figure 2:
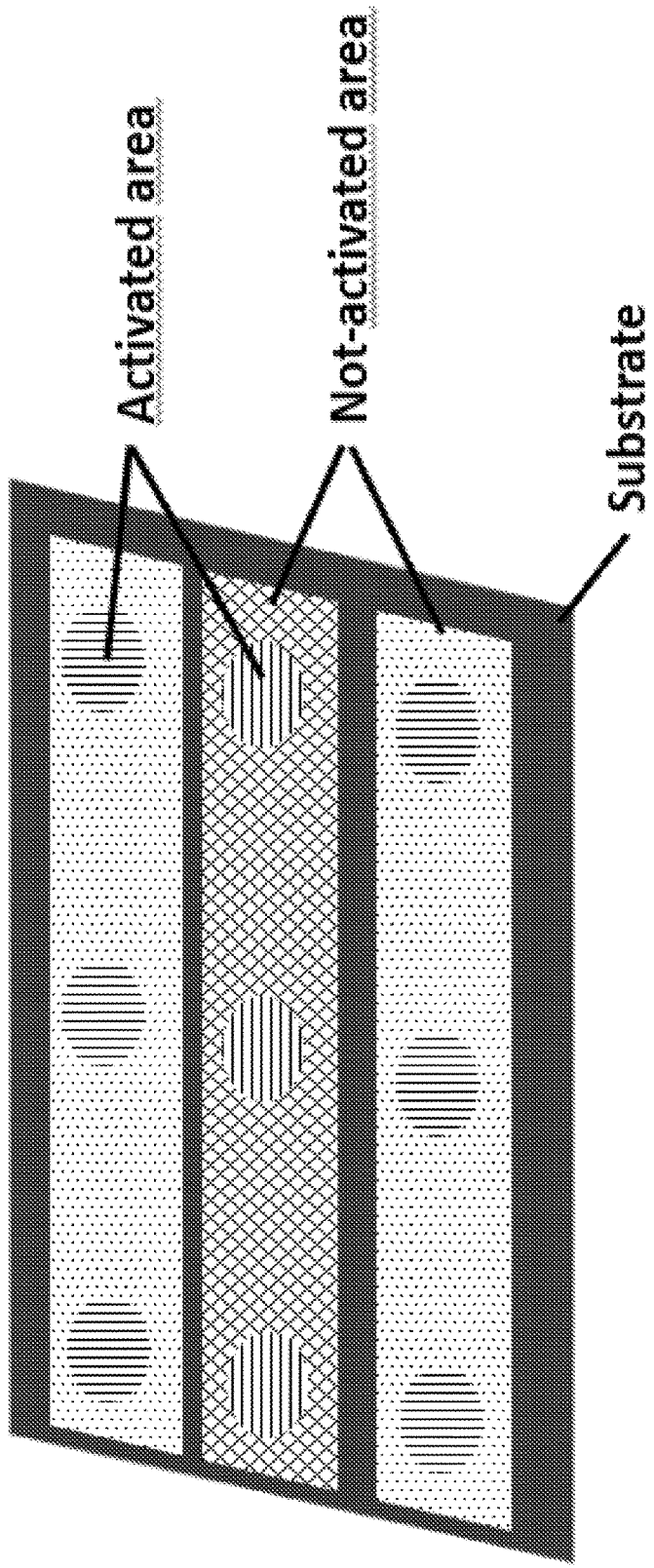
FIG. 2 shows a substrate on which locally 2 different inks (dotted and criss-crossed regions) have been deposited without overlap.

FIG. 2 shows a substrate on which locally 2 different inks (dotted and criss-crossed regions) have been deposited without overlap. These inks have been transformed locally into amorphous silicon of type 1 (horizontal stripes) and of type 2 (vertical stripes). The transformation or converting has taken place punctiformly. The converted region is labelled "activated"; the unconverted region is labelled as "not-activated". In this region there is a silicon oxide.

Example 3

Figure 3:
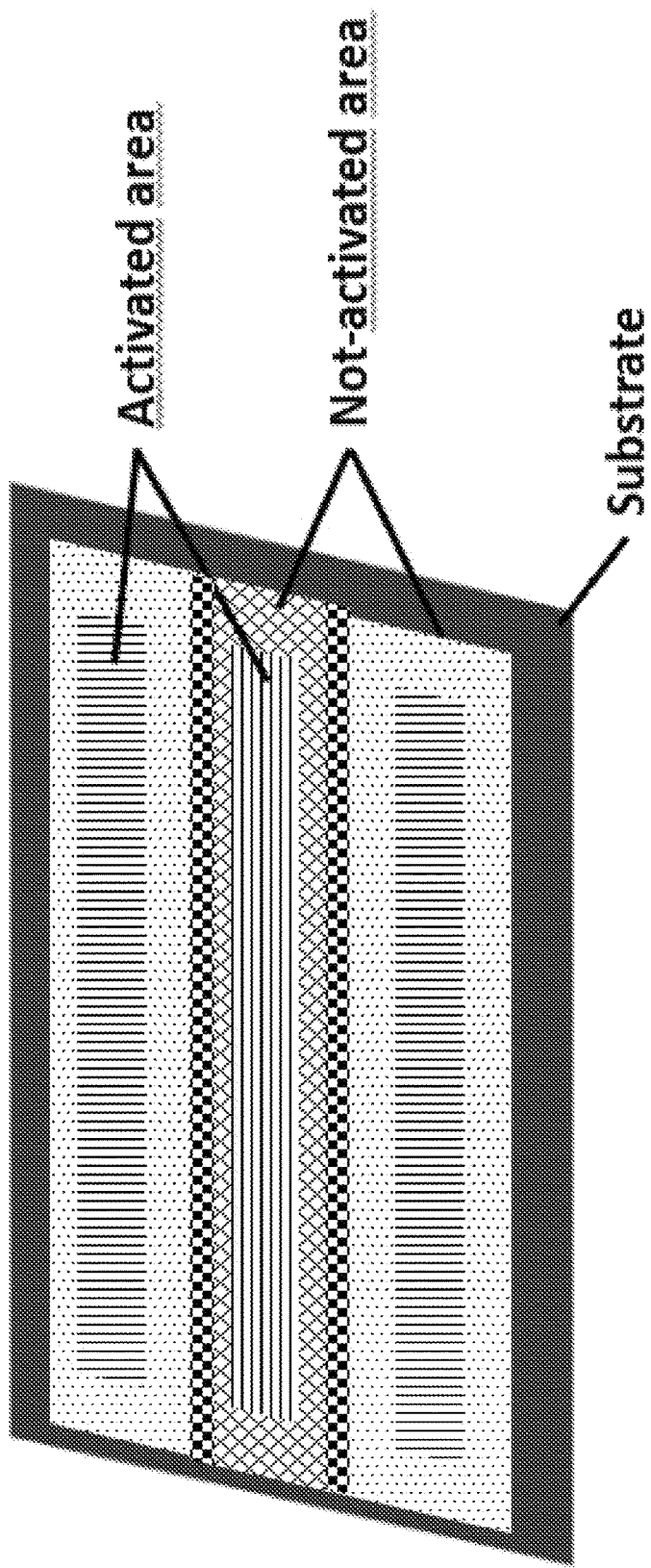
FIG. 3 shows a substrate on which locally 2 different inks (dotted and criss-crossed regions) have been deposited with overlap (chequered regions).

FIG. 3 shows a substrate on which locally 2 different inks (dotted and criss-crossed regions) have been deposited with overlap (chequered regions). These inks have been transformed locally into amorphous silicon of type 1 (horizontal stripes) and of type 2 (vertical stripes). The transformation or converting has taken place linearly. The converted region is labelled "activated"; the unconverted region is labelled as "not-activated". In this region there is a silicon oxide. In the present example there is likewise a silicon oxide in the overlapping region.

The invention claimed is:

1. A liquid-phase process for producing a structured silicon- and/or germanium-containing coating, comprising:
   a) applying at least one coating composition to a substrate, to obtain a coated substrate,
   b) partially activating the resulting coating on the coated substrate, and
   c) oxidizing a non-activated coating on the substrate,
   wherein the coating composition has at least two precursors, of which at least one is a hydridosilane oligomer and at least one is a hydridosilane of the generic formula $Si_nH_{2n+2}$ with n=3 to 10,
   wherein the hydridosilane oligomer is obtainable by thermal reaction of a composition comprising at least one non-cyclic hydridosilane having not more than 20 silicon atoms in the absence of a catalyst at temperatures of less than 235° C.;
   wherein the partially activating of the resulting coating in b) refers to a transformation of the deposited precursors of the resulting coating into an amorphous or a crystalline semiconductor coating.

2. The process according to claim 1, wherein the coating composition comprises at least one solvent and at least one silicon- and/or germanium-containing precursor which is solid or liquid under SATP conditions at 25° C. and 1.013 bar.

3. The process according to claim 1, wherein one precursor has the generic formula $M_nX_c$ with M=Si and/or Ge, X=H, F, Cl, Br, I, $C_1$-$C_{10}$ alkyl, $C_1$-$C_{10}$ alkenyl, $C_5$-$C_{20}$ aryl, n≥4 and 2n≤c≤2n+2.

4. The process according to claim 2, wherein the at least one silicon- and/or germanium-containing precursor is a silicon- and/or germanium-containing nanoparticle.

5. The process according to claim 1, wherein the hydridosilane of the formula $Si_nH_{2n+2}$ is branched.

6. The process according to claim 5, wherein the hydridosilane is isotetrasilane, 2-silyltetrasilane, neopentasilane or a mixture of nonasilane isomers.

7. The process according to claim 1, wherein the hydridosilane oligomer has a weight-average molecular weight of 200 to 10,000 g/mol.

8. The process according to claim 1, wherein the hydridosilane oligomer has been obtained by oligomerization of non-cyclic hydridosilanes.

9. The process according to claim 1, wherein the coating composition is applied in structured form to the substrate.

10. The process according to claim 9, wherein at least two different coating compositions are applied in structured form, simultaneously or successively and also with or without overlap, to different regions of a substrate.

11. The process according to claim 1, wherein the oxidizing takes place in an oxygen-containing atmosphere at a temperature$\leq 300°$ C.

12. The process according to claim 1, wherein the oxidizing is carried out with an oxidizing agent selected from the group consisting of ozone, carbon dioxide, hydrogen peroxide ($H_2O_2$), steam ($H_2O$), a mono- or polyhydric alcohol, a ketone, a carboxylic acid, a carbonic ester and mixtures comprising trichloroacetic acid and oxygen, and also HCl and oxygen.

* * * * *